United States Patent
Bothra et al.

(10) Patent No.: US 11,121,206 B2
(45) Date of Patent: Sep. 14, 2021

(54) INTEGRATED CIRCUIT RESISTOR WITH PASSIVE BREAKDOWN PROTECTION CIRCUIT

(71) Applicant: TEXAS INSTRUMENTS INCORPORATED, Dallas, TX (US)

(72) Inventors: Basant Bothra, Bengaluru (IN); Lokesh Kumar Gupta, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 46 days.

(21) Appl. No.: 16/692,349

(22) Filed: Nov. 22, 2019

(65) Prior Publication Data

US 2020/0312946 A1    Oct. 1, 2020

(30) Foreign Application Priority Data

Mar. 29, 2019 (IN) .............................. 201941012390

(51) Int. Cl.
*H01L 49/02* (2006.01)
*H01L 27/02* (2006.01)

(52) U.S. Cl.
CPC .......... *H01L 28/20* (2013.01); *H01L 27/0248* (2013.01)

(58) Field of Classification Search
None
See application file for complete search history.

(56) References Cited

U.S. PATENT DOCUMENTS

2013/0320498 A1* 12/2013 Salcedo .............. H01L 27/0921
257/565

* cited by examiner

*Primary Examiner* — Hsien Ming Lee
(74) *Attorney, Agent, or Firm* — John R. Pessetto; Charles A. Brill; Frank D. Cimino

(57) ABSTRACT

An electrical device includes an integrated circuit having device circuitry, a passive breakdown protection circuit, and a resistor coupled to or included with the device circuitry. The resistor includes: a polysilicon layer coupled between a first terminal and a second terminal; an epitaxial layer terminal; and a buried layer terminal. The passive breakdown protection circuit is coupled between the second terminal and the epitaxial layer terminal. The passive breakdown protection circuit is also coupled between the epitaxial layer terminal and the buried layer terminal.

18 Claims, 6 Drawing Sheets

INTEGRATED CIRCUIT RESISTOR WITH PASSIVE BREAKDOWN PROTECTION CIRCUIT

CROSS-REFERENCE TO RELATED APPLICATIONS

This application claims priority to Indian Provisional Application No. 201941012390, filed Mar. 29, 2019, which is hereby incorporated by reference.

BACKGROUND

There are many different electrical system designs, each appropriate for a given scenario. Efforts to improve on electrical system designs and components are ongoing and involve commercialization of different system components. The use of semiconductor technology and the proliferation of consumer and industrial applications for semiconductor-based circuits drive product development. In summary, there is a competition to provide low-cost and functional electrical system components for use in consumer and industrial applications around the world.

Semiconductor resistors and other semiconductor devices have limitations with regard to their capacity to handle voltages higher than a threshold (referred to as a breakdown voltage). In one type of semiconductor resistor, referred to as polysilicon resistors (or just poly resistors), the breakdown voltage is affected by imperfections in the manufacturing process. One type of imperfection is shallow trench isolation (STI) cone defects cause by blocked STI trench etch. With such cone defects, oxide thickness is reduced at the cone region, which reduces the oxide breakdown voltage. Such imperfections limit the breakdown voltage and thus the versatility of semiconductor resistors.

SUMMARY

In accordance with at least one example of the disclosure, an electrical device comprises an integrated circuit having device circuitry, a passive breakdown protection circuit, and a resistor coupled to or included with the device circuitry. The resistor comprises: a polysilicon layer coupled between a first terminal and a second terminal; an epitaxial layer terminal; and a buried layer terminal. The passive breakdown protection circuit is coupled between the second terminal and the epitaxial layer terminal. The passive breakdown protection circuit is also coupled between the epitaxial layer terminal and the buried layer terminal.

In accordance with at least one example of the disclosure, an integrated circuit comprises an input voltage node, a ground node, and a semiconductor resistor coupled between the input voltage node and the ground node. The integrated circuit also comprises a passive breakdown protection circuit coupled to the semiconductor resistor. The semiconductor resistor comprises: a polysilicon layer coupled between a first terminal and a second terminal; an epitaxial layer terminal; and a buried layer terminal. The passive breakdown protection circuit is coupled between the second terminal and the epitaxial layer terminal. The passive breakdown protection circuit is also coupled between the epitaxial layer terminal and the buried layer terminal.

In accordance with at least one example of the disclosure, a polysilicon resistor arrangement comprises a first polysilicon resistor having a first terminal, a second terminal, an epitaxial layer terminal, and a buried layer terminal. The polysilicon resistor arrangement also comprises a second polysilicon resistor coupled between the second terminal and the epitaxial layer terminal. The polysilicon resistor arrangement also comprises a third polysilicon resistor coupled between the epitaxial layer terminal and the buried layer terminal.

BRIEF DESCRIPTION OF THE DRAWINGS

For a detailed description of various examples, reference will now be made to the accompanying drawings in which.

DETAILED DESCRIPTION

Disclosed herein are polysilicon resistor topologies with a passive breakdown protection circuit. In some examples, a polysilicon resistor as disclosed herein is a component of an integrated circuit (IC) with device circuitry. The polysilicon resistor is either part of the device circuitry or is coupled to the device circuitry. An example IC with a polysilicon resistor is a Controller Area Network (CAN) transceiver IC. In this example, the disclosed polysilicon resistor is used with an input voltage that can vary widely (e.g., +/−60V). With the passive breakdown protection circuit, the disclosed polysilicon resistor is compatible with a wide range of positive and negative input voltage ranges as in the CAN transceiver IC example. While the disclosed polysilicon resistor topologies with a passive breakdown protection circuit were developed for use with a CAN transceiver IC, other uses are possible. To provide a better understanding, various polysilicon resistor options, passive breakdown protection circuit options, and related IC options are described using the figures as follows.

Figure 1A:
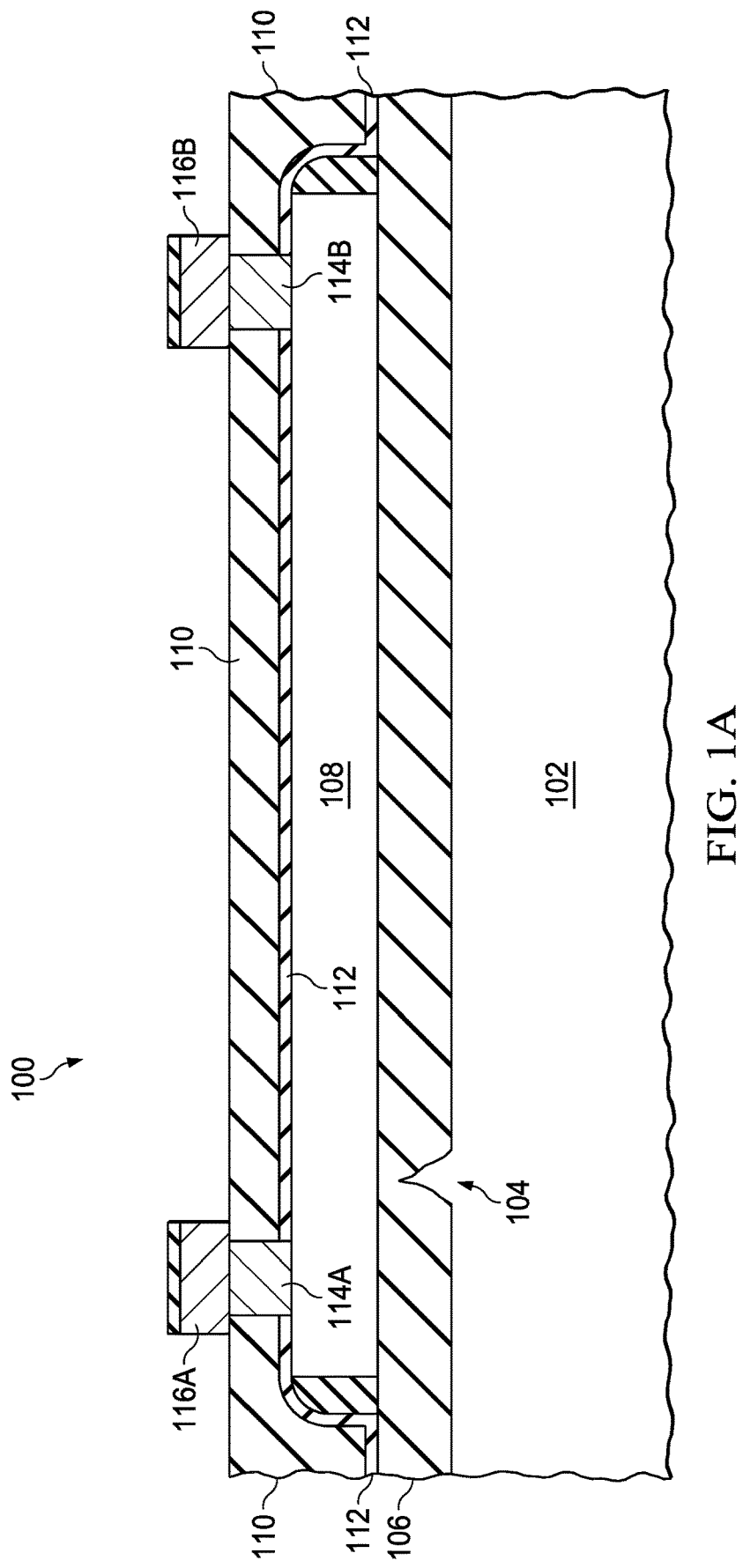
FIG. 1A is cross-sectional view of a polysilicon resistor in accordance with some examples.

FIG. 1A is cross-sectional view of a polysilicon resistor 100 in accordance with some examples. As shown, the polysilicon resistor 100 includes a silicon substrate 102, a shallow trench isolation (STI) oxide layer 106, a polysilicon layer 108, a nitride layer 112, a deposited oxide (ILO) layer 110, contacts 114A and 114B that extend from the polysilicon layer 108, a metal layer 116A on the contact 114A, and a metal layer 116B associated with the contact 114B. Also, represented in FIG. 1 is a cone defect 104 in the silicon substrate 102. The cone defect 104 affects the thickness of the STI oxide layer 106 at the location of the cone defect 104, which alters the breakdown voltage of the polysilicon resistor 100.

Figure 1B:
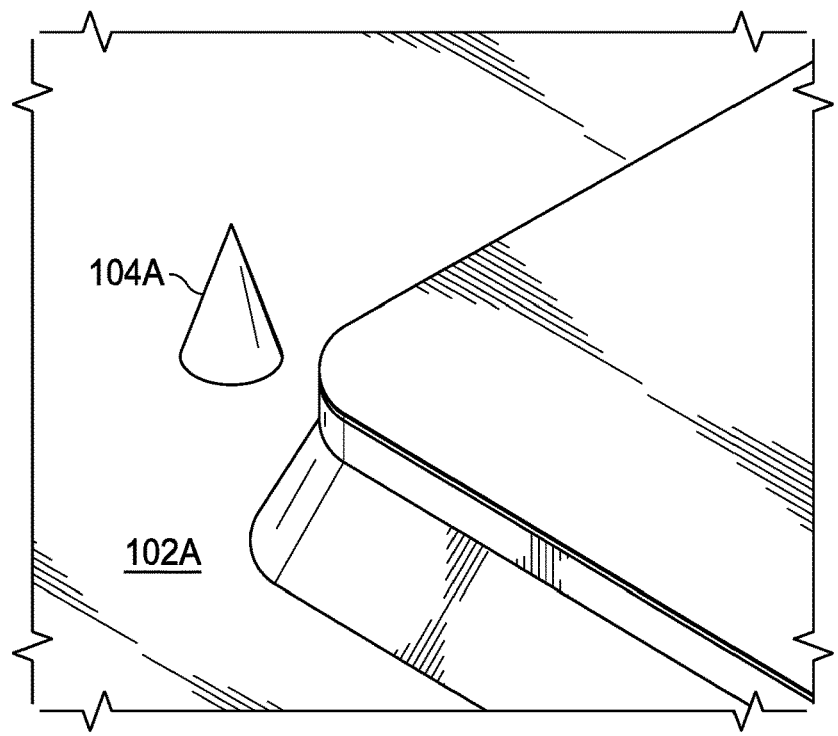
FIG. 1B is a perspective view of a cone defect on a silicon substrate in accordance with some examples.

FIG. 1B is a perspective view of a cone defect 104A (an example of the cone defect 104 in FIG. 1A) on a silicon substrate 102A (an example of the silicon substrate 102A in FIG. 1A) in accordance with some examples. The cone defect 104A affects the thickness of a subsequently added STI oxide layer (e.g., the STI oxide layer 106) that goes over the silicon substrate 102A, which alters the breakdown voltage of the polysilicon resistor 100.

Figure 2A:
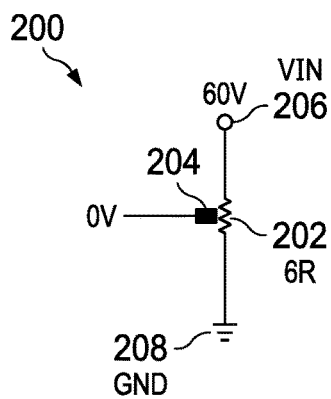
FIG. 2A is a polysilicon resistor symbol in accordance with some examples.

FIG. 2A is a polysilicon resistor symbol 200 in accordance with some examples. The polysilicon resistor symbol 200 includes a resistor symbol 202 as well as a bias node 204. The bias node 204 signifies that breakdown of a polysilicon resistor associated with the resistor symbol 202 is affected by the voltage at the bias node 204, which corresponds to a silicon substrate (e.g., the silicon substrate 102 in FIG. 1A, or the silicon substrate 102A in FIG. 1B). In the example of FIG. 2A, the polysilicon resistor symbol 200 also includes the label "6R" which signifies that the resistance of a polysilicon resistor associated with the resistor symbol 202 is segmented into 6 series resistors. As shown, the resistor symbol 202 is positioned between an input voltage node 206 (e.g., at 60V) and a ground node 208 (e.g., at 0V). Polysilicon resistor symbols such as the polysilicon resistor symbol 200 will later be used to describe polysilicon resistor topologies with a passive breakdown protection circuit.

Figure 2B:
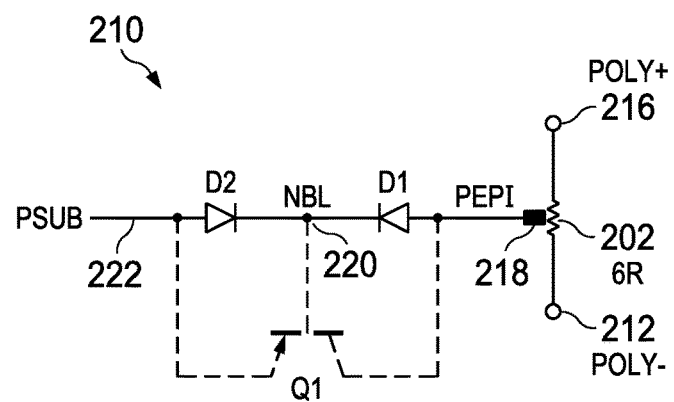
FIG. 2B is a polysilicon resistor schematic diagram in accordance with some examples.

FIG. 2B is a polysilicon resistor symbol 210 in accordance with some examples. The polysilicon resistor symbol 210 includes the resistor symbol 202 as well as a p-type epitaxial (Pepi) node 218 (an example of the bias node 204 in FIG. 2A), where the breakdown of a polysilicon resistor associated with the resistor symbol 202 in FIG. 2B is affected by the voltage at the Pepi node 218. In the example of FIG. 2B, the polysilicon resistor symbol 210 also includes a first diode (D1) between the Pepi node 218 and an n-type buried layer (NBL) node 220, where the anode of D1 faces the Pepi node 218 and the cathode of D1 faces the NBL node 220. The polysilicon resistor symbol 210 also includes a second diode (D2) between the NBL node 220 and a p-type substrate (PSUB) node 222, where the anode of D2 faces the PSUB node 222 and the cathode of D2 faces the NBL node 220. Also represented in FIG. 2B is a PNP transistor (Q1) having its base terminal coupled to the NBL node 220, its emitter terminal coupled to the PSUB node 222, and its collector terminal coupled to the Pepi node 218. In some examples, the PSUB node 222 is coupled to a collector terminal, and the Pepi node 218 is coupled to an emitter terminal depending upon D1 being on in forward bias or D2 being on in forward bias. The polysilicon resistor symbol 210 of FIG. 2B is a more detailed representation compared to the polysilicon resistor symbol 200 of FIG. 2A and will later be used to describe polysilicon resistor topologies with a passive breakdown protection circuit.

Figure 3:
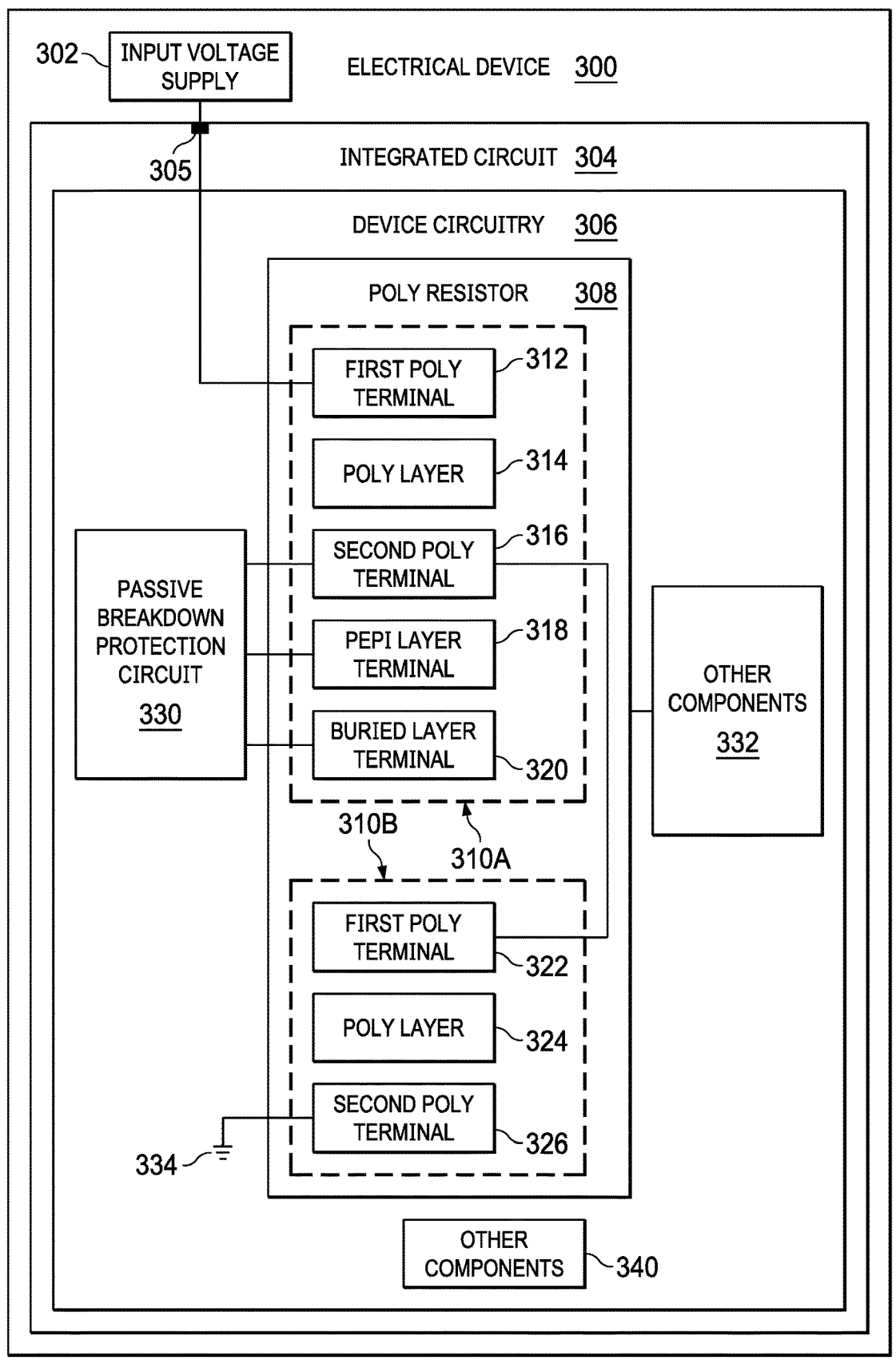
FIG. 3 is an electrical device with a polysilicon resistor and passive breakdown protection circuit in accordance with some examples.

FIG. 3 is an electrical device 300 with a polysilicon resistor 308 and passive breakdown protection circuit 330 in accordance with some examples. In different examples, the electrical device 300 corresponds to a packaged chip, a multi-die module (MDM), or a printed circuit board (PCB) with at least one IC and with discrete components as needed. In one example, the electrical device 300 includes an integrated circuit 304 with device circuitry 306, where the device circuitry 306 is part of a CAN transceiver. In other examples, the device circuitry 306 is part of a Local Interconnect Network (LIN) transceiver. In other examples, the device circuitry 306 is part of a communication interface, where the VIN range from the input voltage supply 302 can vary over time between positive and negative values.

In the example of FIG. 3, the device circuitry 306 is represented as including the polysilicon resistor 308 and the passive breakdown protection circuit 330. In other examples, the polysilicon resistor 308 and the passive breakdown protection circuit 330 could be external to and coupled to the device circuitry 306. In either case, the polysilicon resistor 308 is coupled between the input voltage supply 302 and a ground node 334, where the polysilicon resistor 308 includes multiple resistor segments 310A and 310B. While the example of FIG. 3 shows a polysilicon resistor 308 with two resistor segments 310A and 310B, it should be appreciated that other polysilicon resistors include more resistor segments. Regardless of the number of resistor segments, the use of a passive breakdown protection circuit 330 provides breakdown protection for the polysilicon resistor 308 and its resistor segments (e.g., the resistor segments 310A and 310B). Also, regardless of the number of resistor segments, intermediate nodes (e.g., the second polysilicon terminal 316 of the resistor segment 310A and the first polysilicon terminal 322 of the resistor segment 310B are examples of intermediate nodes) of the polysilicon resistor 308 are available to couple to components of the device circuitry 306 (e.g., the other components 332) and/or other components 340 of the IC 304 to provide different voltage levels (between VIN and ground).

As shown, the resistor segment 310A includes a first polysilicon terminal 312 (e.g., a "+" polysilicon terminal), a polysilicon layer 314, a second polysilicon terminal 316 (e.g., a "−" polysilicon terminal), a Pepi layer terminal 318, and a buried layer terminal 320. In the example of FIG. 3, the first polysilicon terminal 312 is coupled to the input voltage supply 302. Also, the passive breakdown protection circuit 330 is coupled between the second polysilicon terminal 316, the Pepi layer terminal 318, and the buried layer terminal 320. The second polysilicon terminal 316 is also coupled to the first polysilicon terminal 322 (e.g., a "+" polysilicon terminal) of the resistor segment 310B. The resistor segment 310B also includes a polysilicon layer 324 and a second polysilicon terminal 316 (e.g., a "−" polysilicon terminal).

In some examples, if the polysilicon resistor 308 includes more resistor segments, intermediate resistor segments would be coupled in series between the resistor segment 310A and the resistor segment 310B. In such case, the second polysilicon terminal 316 would be coupled to the first polysilicon terminal of the next resistor segment instead of the first polysilicon terminal 322 of the resistor segment 310B. Also, the first polysilicon terminal 322 of the resistor segment 310B would be coupled to the second polysilicon terminal of the last intermediate resistor segment instead of the second polysilicon terminal 316 of the resistor segment 310A. In some examples, regardless of the total number of resistor segments for the polysilicon resistor 308, the passive breakdown protection circuit 330 is coupled between the second polysilicon terminal, the Pepi layer terminal, and the buried layer terminal of only one of the resistor segments. In other examples involving multiple resistor segments, the passive breakdown protection circuit 330 is coupled between the respective terminals (e.g., the polysilicon terminal, the Pepi layer terminal, and the buried layer terminal) for each of multiple resistor segments. Also, in different examples, the Pepi layers and buried layers of different resistor segments are shared or are not shared (e.g., only the PSUB is shared). Additional layer details relevant to each resistor segment (e.g., the resistor segments 310A and 310B in FIG. 3) are given in FIG. 4.

Figure 4:
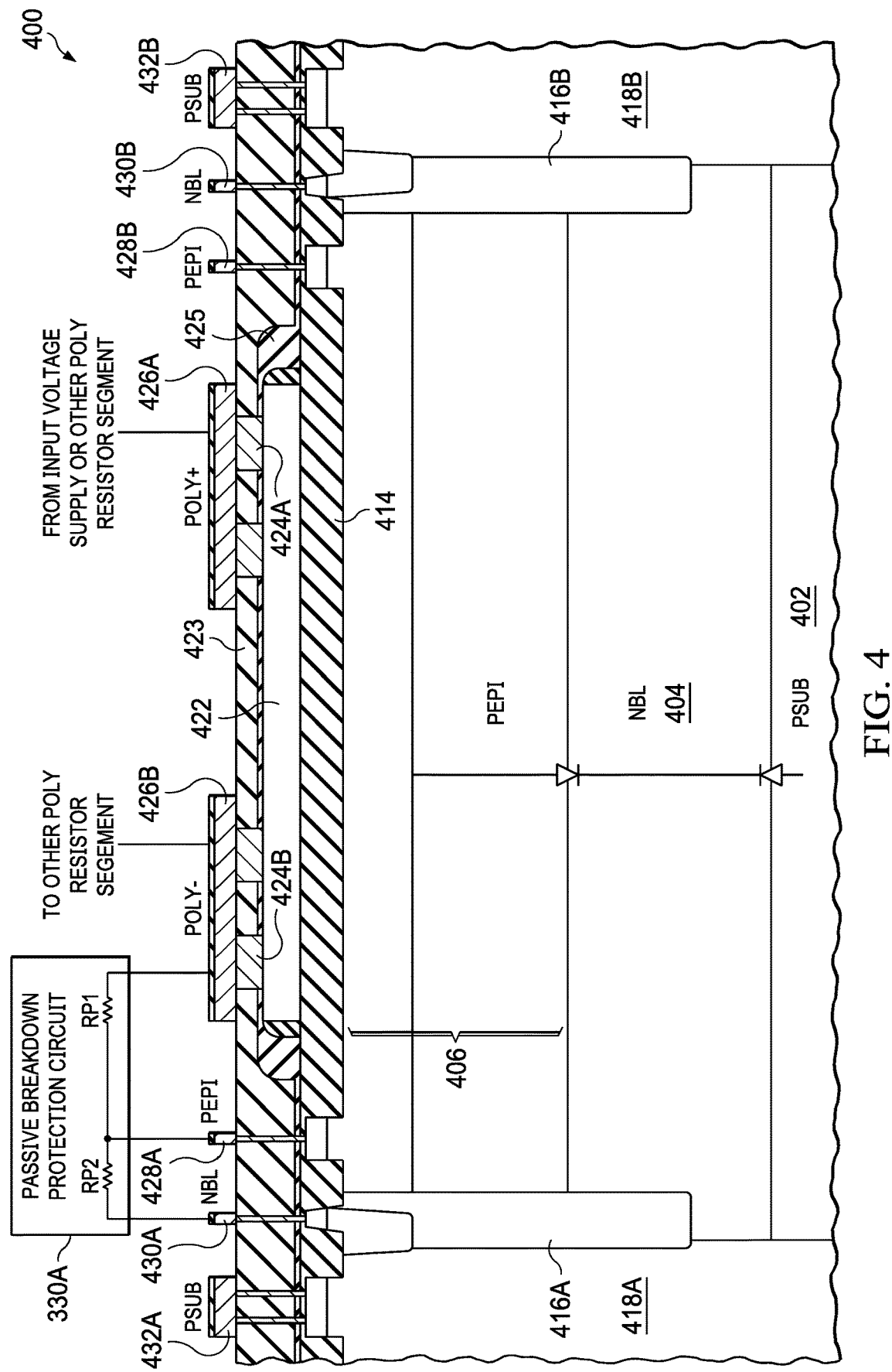
FIG. 4 is diagram with polysilicon resistor layers and a passive breakdown protection circuit in accordance with some examples.

FIG. 4 is diagram 400 with polysilicon resistor layers and a passive breakdown protection circuit 330A (an example of the passive breakdown protection circuit 330 in FIG. 3) in accordance with some examples. As represented in the diagram 400, the polysilicon resistor layers include a p-type substrate (PSUB) 402, an n-type buried layer (NBL) 404, and a Pepi layer 406. The polysilicon resistor layers represented in the diagram 400 also include an STI layer 414, a polysilicon layer 422, a nitride layer 425, and a deposited oxide (ILO) layer 423.

In FIG. 4, the polysilicon resistor includes contacts 424A that extend between the polysilicon layer 422 and a first polysilicon terminal 426A (e.g., a "+" polysilicon terminal, an example of the first polysilicon terminal 312 in FIG. 3, or an example of the first polysilicon terminal 322 in FIG. 3). The polysilicon resistor of FIG. 4 also includes contacts 424B that extend between the polysilicon layer 422 and a second polysilicon terminal 426B (e.g., a "−" polysilicon terminal, an example of the second polysilicon terminal 316 in FIG. 3, or the second polysilicon terminal 326 in FIG. 3). The polysilicon resistor of FIG. 4 also includes PSUB terminals 432A and 432B coupled to the PSUB 402 via respective p-type (p+) deep trenches 418A and 418B. The polysilicon resistor of FIG. 4 also includes NBL terminals 430A and 430B coupled to the NBL 404 via respective n-type deep trenches 416A and 416B. The polysilicon resistor of FIG. 4 also includes Pepi layer terminals 428A and 428B coupled to the Pepi layer 406.

In the example of FIG. 4, the various terminals (e.g., the first polysilicon terminal 426A, the second polysilicon terminal 426B, the PSUB terminals 432A and 432B, the NBL terminals 430A and 430B, the Pepi layer terminal 428A and 428B) are metallic surfaces used to couple the polysilicon resistor (or resistor segment) to other components and/or to bias the different layers of the polysilicon resistor. For example, in FIG. 4, the first polysilicon terminal 426A is coupled to an input voltage supply (similar to the resistor segment 310A in FIG. 3). In another example, the first polysilicon terminal 426A is coupled to another polysilicon resistor segment (e.g., if the polysilicon resistor of FIG. 4 is used as an intermediate resistor segment). Meanwhile, the second polysilicon terminal 426B is coupled to another polysilicon resistor segment (an intermediate resistor segment or final resistor segment). In addition, the second polysilicon terminal 426B is coupled to the passive breakdown protection circuit 330A. The NBL terminal 430A and the Pepi layer terminal 428A are also coupled to the passive breakdown protection circuit 330A.

Figure 5:
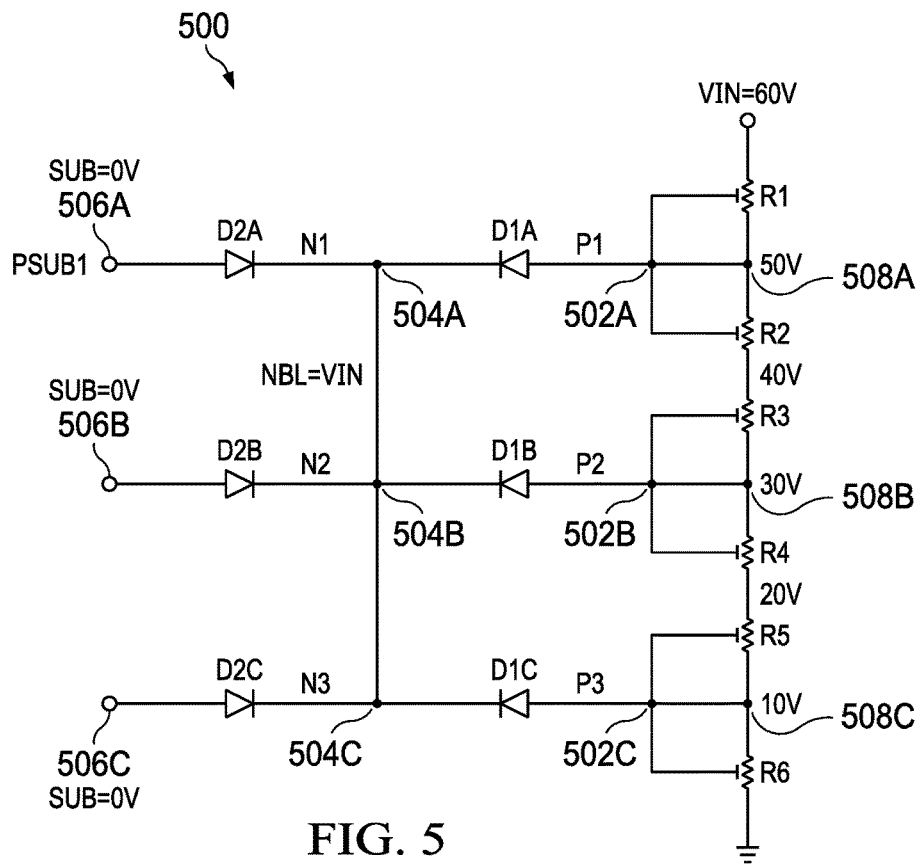
FIG. 5 is schematic diagram of a polysilicon resistor in a positive input voltage scenario in accordance with some examples.

In the example of FIG. 4, the passive breakdown protection circuit 330A includes a first resistor (R1) between the first polysilicon terminal 426A and the Pepi layer terminal 428A. The passive breakdown protection circuit 330A also includes a second resistor (R2) between the second polysilicon terminal 426B and the NBL terminal 430A. In different examples, the values of R1 and R2 vary depending on the total resistance of a polysilicon resistor, the resistance of each resistor segment, the intended voltage drop across each resistor segment, the range of VIN, the breakdown voltage of different junctions including the polysilicon-Pepi junction, and/or other factors. In some examples, R1 and R2 are polysilicon resistors such that a single IC includes a polysilicon resistor as well as the components of the passive breakdown protection circuit used to avoid breakdown of the polysilicon resistor. Also, in some examples, a polysilicon resistor has multiple resistor segments as described herein, where the passive breakdown protection circuit is coupled to the terminals of only one of the multiple resistor segments. In other examples, depending upon the factors mentioned above (e.g., the intended values of R1 and R2 for passive breakdown protection circuit, the resistance of each resistor segment, the intended voltage drop across each resistor segment, the range of VIN, the breakdown voltage of different junctions including the polysilicon-Pepi junction, and/or other factors), the passive breakdown protection circuit is coupled to the respective terminals of each of multiple resistor segments FIG. 5 is schematic diagram of a polysilicon resistor 500 in a positive input voltage scenario in accordance with some examples. In FIG. 5, the polysilicon resistor 500 has six equal resistor segments (R1-R6). As represented in FIG. 5, each of R1 and R2 are biased by a Pepi node 502A (an example of the Pepi node 218 in FIG. 2) coupled to an intermediate node 508A between R1 and R2. Also, a first diode (D1A) is represented between the Pepi node 502A and a buried layer node 504A, where the anode of D1A faces the Pepi node 502A and the cathode of D1A faces the buried layer node 504A. Also, a second diode (D2A) is represented between the buried layer node 504A and a PSUB node 506A, where the anode of D2A faces the PSUB node 506A and the cathode of D2A faces the buried layer node 504A.

In FIG. 5, each of R3 and R4 are biased by a Pepi node 502B (an example of the Pepi node 218 in FIG. 2) coupled to an intermediate node 508B between R3 and R4. Also, a first diode (D1B) is represented between the Pepi node 502B and a buried layer node 504B, where the anode of D1B faces the Pepi node 502B and the cathode of D1B faces the buried layer node 504B. Also, a second diode (D2B) is represented between the buried layer node 504B and a PSUB node 506B, where the anode of D2B faces the PSUB node 506B and the cathode of D2B faces the buried layer node 504B.

In FIG. 5, each of R5 and R6 are biased by a Pepi node 502C (an example of the Pepi node 218 in FIG. 2) coupled to an intermediate node 508C between R5 and R6. Also, a first diode (D1C) is represented between the Pepi node 502C and a buried layer node 504C, where the anode of D1C faces the Pepi node 502C and the cathode of D1C faces the buried layer node 504C. Also, a second diode (D2C) is represented between the buried layer node 504C and a PSUB node 506C, where the anode of D2C faces the PSUB node 506C and the cathode of D2C faces the buried layer node 504C. In FIG. 5, the PSUB nodes 506A-506C are coupled together and are set at 0V. Also, the buried layer nodes 504A-504C are coupled together and are set at VIN (e.g., VIN=60V).

With the polysilicon resistor 500 in FIG. 5, different voltage levels are available due to the voltage drops provided by R1-R6. For example, if VIN=60V, then 50V is available between R1 and R2, 40V is available between R2 and R3, 30V is available between R3 and R4, 20V is available between R4 and R5, and 10V is available between R5 and R6. With the polysilicon resistor 500 in FIG. 5, the related Pepi layer (e.g., the Pepi layer 406 in FIG. 4) is coupled to the intermediate nodes 508A-508C such that polysilicon terminal voltage minus the Pepi layer voltage is restricted to a max of 10V to achieve a target defective parts per million (dppm) goal (e.g., dppm<1). However, if the related NBL (e.g., NBL 404 in FIG. 4) is biased to VIN (max voltage) as represented in FIG. 5 and VIN=+60V, the voltage from the Pepi node 506 to the buried layer node 504C will have voltage difference 60V−10V=50V, which is greater than a breakdown voltage of 30V. Also, for VIN=−60V, D2A, D2B, and D2C, will be forward bias and will take high current.

Figure 6:
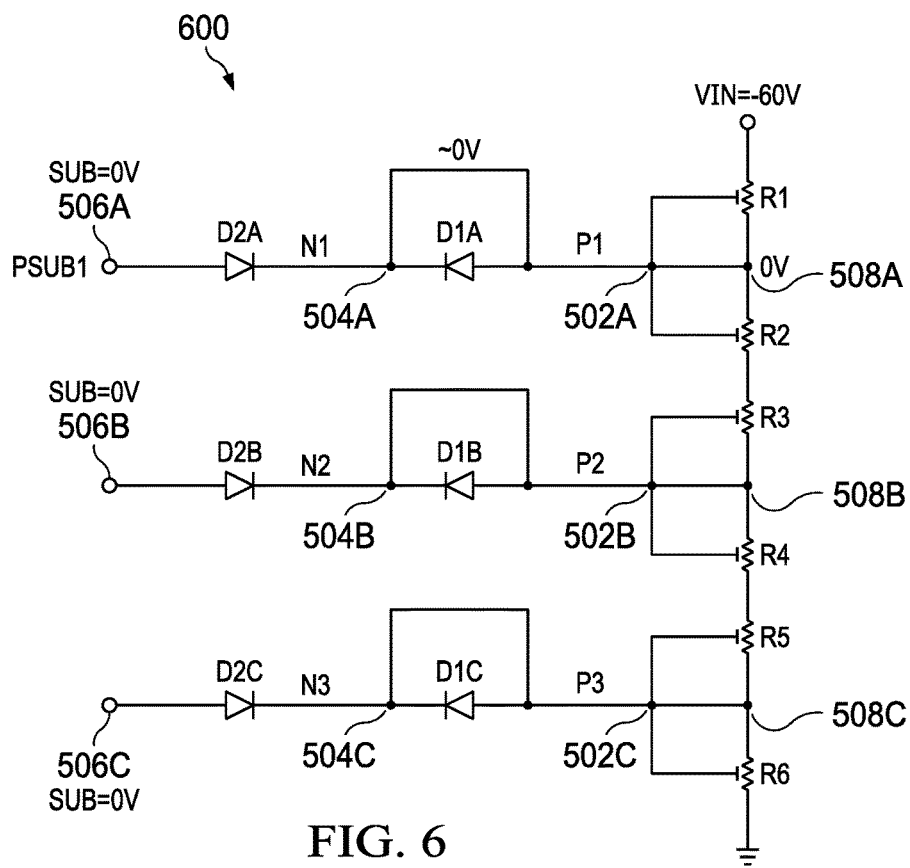
FIG. 6 is schematic diagram of a polysilicon resistor in a negative input voltage scenario in accordance with some examples.
Figure 7:
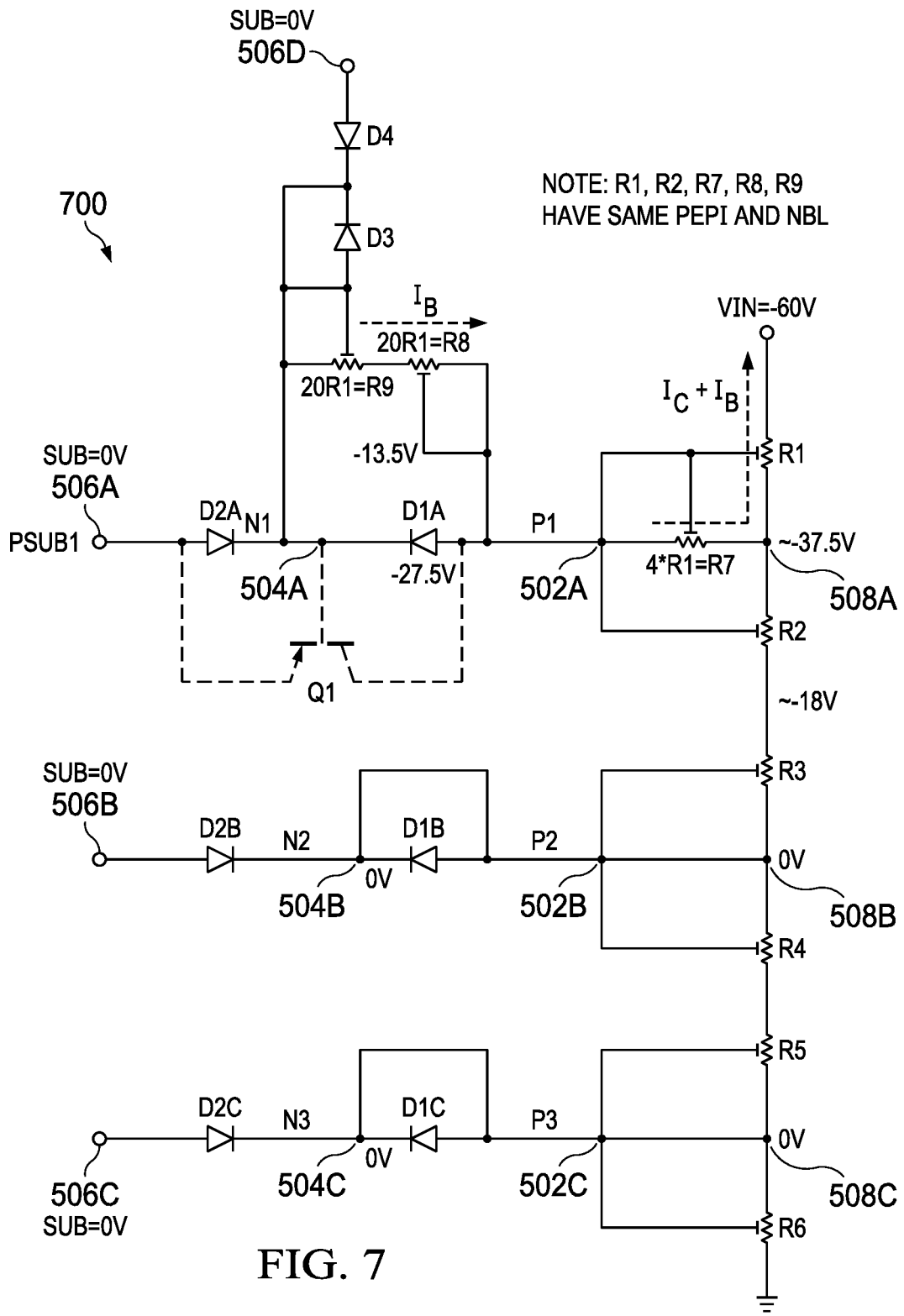
FIG. 7 is schematic diagram of a polysilicon resistor with passive breakdown protection circuitry in a negative input voltage scenario in accordance with some examples.

FIG. 6 is schematic diagram of a polysilicon resistor 600 in a negative input voltage scenario in accordance with some examples. The polysilicon resistor 600 of FIG. 6 has an arrangement similar to the polysilicon resistor 500 of FIG. 5, except that buried layer nodes 504A-504C are shorted to respective Pepi nodes 502A-502C. If an NBL (e.g., NBL 404 in FIG. 4) is shorted to a Pepi layer (e.g., the Pepi layer 406 in FIG. 4) as represented in FIG. 6, then the voltage drop across R1 will be stressed to ~−60V for VIN=−60V as the diode D2A will be forward biased and the buried layer 504A will be grounded FIG. 7 is schematic diagram of a polysilicon resistor 700 with passive breakdown protection circuitry (e.g., R7-R9) in a negative input voltage scenario in accordance with some examples. The polysilicon resistor 700 of FIG. 7 has an arrangement similar to the polysilicon resistor 600 of FIG. 6, except that resistors R8 and R9 (R8=R9=20*R, where R is any of R1-R6) are positioned between the buried layer node 504A and the Pepi node 502A. Also, a resistor R7 (R7=4*R, where R is any of R1-R6) is positioned between the Pepi node 502A and the intermediate node 508A. Thus, R7+R8+R9 is in series between intermediate node 508A and the buried layer node 504A. If VIN=+/−60V, R=8 kΩ is an acceptable value. With R8 and R9 the current through the parasitic PNP device (Q1) is reduced, which in turn reduces the voltage across R1. R7 is used to reduce the voltage drop across R8 and R9 to achieve a target dppm (e.g., dppm<1). In the example of FIGS. 7, R7 and R8 are polysilicon resistors with the same Pepi layer (e.g., the Pepi layer 406 in FIG. 4) and NBL (e.g., NBL 404 in FIG. 4) as R1 and R2. In some examples, to take into account the polysilicon-Pepi voltage across R9, its Pepi terminal is shorted to its NBL terminal, whose NBL is same as R1, R2, R7 and R8. Also, the anode of D4 or the PSUB node 506D is set to 0V similar to the PSUB nodes 506A-506C. In a negative input voltage scenario (e.g., VIN=−60V), the current flow through R8 and R9 is $I_B$ and the flow through R7 and R1 is $I_C+I_B$. With R7=4*R1, $I_C+I_B$ drops ~10V across R7 and a target dppm<1 is achieved.

As disclosed herein, in some examples, an electrical device (e.g., electrical device 300 in FIG. 3) includes an integrated circuit (e.g., the integrated circuit 304 in FIG. 3) having device circuitry (e.g., the device circuitry 306 in FIG. 3) and a passive breakdown protection circuit (e.g., the passive breakdown protection circuit 330 in FIG. 3). The integrated circuit also includes a resistor (e.g., the polysilicon resistor 308 in FIG. 3) coupled to or included with the device circuitry. The resistor includes a polysilicon layer (e.g., the polysilicon layer 314 in FIG. 3, or the polysilicon layer 422 in FIG. 4) coupled between a first terminal (e.g., the first polysilicon terminal 312 in FIG. 3, or the first polysilicon terminal 426A in FIG. 4) and a second terminal (e.g., the second polysilicon terminal 316 in FIG. 3, or the second polysilicon terminal 426B in FIG. 4). The resistor also includes an epitaxial layer terminal (e.g., the Pepi terminal 318 in FIG. 3, or the Pepi terminals 428A and 428B in FIG. 4) and a buried layer terminal (e.g., the buried layer terminal 320 in FIG. 3, or the NBL terminals 430A and 430B in FIG. 4). The passive breakdown protection circuit is coupled between the second terminal and the epitaxial layer terminal. Also, the passive breakdown protection circuit is coupled between the epitaxial layer terminal and the buried layer terminal.

The resistor also includes a substrate (e.g., PSUB 402 in FIG. 4) and a buried layer (e.g., NBL 404 in FIG. 4) on the substrate and coupled to the buried layer terminal, wherein the buried layer is a n-type buried layer (NBL). The resistor also includes an epitaxial layer (e.g., the Pepi layer 406 in FIG. 4) on the buried layer and coupled to the epitaxial layer terminal, wherein the epitaxial layer is a p-type epitaxial (Pepi) layer. As disclosed herein, the resistor is a segmented resistor having a plurality of series resistive segments (e.g., resistor segments 310A and 310B in FIG. 3, or R1-R6 in FIGS. 7 and 8). In some examples, each of the plurality of series resistive segments comprises a shared substrate (e.g., PSUB 402 in FIG. 4, or the PSUB related to nodes 506A-506C in FIGS. 7 and 8), an unshared buried layer (e.g., the NBL 404 in FIG. 4, on the NBL related to nodes 504A-504C in FIGS. 7 and 8), and an unshared epitaxial layer (e.g., the Pepi layer 406 in FIG. 4, or the Pepi layer related to the nodes 502A-502C in FIG. 5). In other examples, each of the plurality of series resistive segments comprises a shared substrate layer, a shared buried layer, and a shared epitaxial.

In some examples, the first and second terminals are associated with a first of the series resistive segments (e.g., the resistor segment 310A in FIG. 3, or R1 in FIGS. 7 and 8), and wherein each of the series resistive segments includes: 1) a respective first terminal (e.g., the first polysilicon terminal 312 in FIG. 3, or the first polysilicon terminal 426A in FIG. 4); 2) a respective second terminal (e.g., the second polysilicon terminal 316 in FIG. 3, or the second polysilicon terminal 426B in FIG. 4); and 3) a respective polysilicon layer (e.g., the polysilicon layer 314 in FIG. 3, or the polysilicon layer 422 in FIG. 4) coupled between the respective first and second terminals.

In some examples, the electrical device also includes an input voltage supply 302, wherein the first terminal (e.g., the first polysilicon terminal 312 in FIG. 3, or the first polysilicon terminal 424A in FIG. 4) of the first of the series resistive segments (e.g., the resistor segment 310A in FIG. 3, or R1 in FIGS. 7 and 8) is coupled to the input voltage supply. Also, the second terminal (e.g., the second polysilicon terminal 326 in FIG. 3, or the second polysilicon terminal 426B in FIG. 4) of a last of the series resistive segments is coupled to a ground node (e.g., ground node 334 in FIG. 3). Also, the passive breakdown protection circuit is coupled between an epitaxial layer terminal (e.g., the Pepi layer terminal 318 in FIG. 3, or the Pepi layer terminals 428A and 428B in FIG. 4) of the resistor and one of the first or second terminals (e.g., the second polysilicon terminal 316 in FIG. 3, or the first polysilicon terminal 322 in FIG. 3) between the first terminal (e.g., the first polysilicon terminal 312 in FIG. 3) of the first of the series resistive segments and the second terminal (e.g., the second polysilicon terminal 326 in FIG. 3) of the last of the series resistive segments. In some examples, the input voltage supply is selectively positive or negative.

In some examples, the resistor is a first resistor, and wherein the passive breakdown protection circuit comprises a second resistor (e.g., RP1 in FIG. 4) between the second terminal and the epitaxial layer terminal, and wherein a resistance value of the second resistor is greater than a resistance value for each of the series resistive segments. In some examples, the passive breakdown protection circuit comprises a third resistor (e.g., RP2 in FIG. 4) between the epitaxial layer terminal and the buried layer terminal, and wherein a resistance value of the third resistor is greater than a resistance value for each of the series resistive segments.

In some examples, the device circuitry (e.g., the device circuitry 306 in FIG. 3) includes CAN transceiver circuitry coupled to one of the first or second terminals between the first terminal of the first of the series resistive segments and the second terminal of the last of the series resistive segments. In some examples, the device circuitry includes LIN transceiver circuitry coupled to one of the first or second terminals between the first terminal of the first of the series resistive segments and the second terminal of the last of the series resistive segments.

In some examples, a polysilicon resistor arrangement includes a first polysilicon resistor (e.g., the polysilicon resistor 308 in FIG. 3) having a first terminal (e.g., the first polysilicon terminal 312 in FIG. 3), a second terminal (e.g., the second polysilicon terminal 316 in FIG. 3), an epitaxial layer terminal (e.g., the Pepi layer terminal 318 in FIG. 3), and a buried layer terminal (e.g., the buried layer 320 in FIG. 3). Also, polysilicon resistor arrangement also includes a second polysilicon resistor (e.g., RP1 in FIG. 4) coupled between the second terminal and the epitaxial layer terminal. The polysilicon resistor arrangement also includes a third polysilicon resistor (e.g., RP2 in FIG. 4) coupled between the epitaxial layer terminal and the buried layer terminal. In some examples, the first polysilicon resistor is a segmented resistor having a plurality of series resistive segments (e.g., the resistor segments 310A and 310B in FIG. 3, or R1-R6 in FIGS. 7 and 8), where each of the plurality of series resistive segments comprises a shared substrate (e.g., PSUB 402 in FIG. 4, or the PSUB related to nodes 506A-506C in FIGS. 7 and 8). In different examples, other layers of the resistive segments (e.g., buried layers and/or epitaxial layers as described herein) are shared or are not shared. In some examples, a resistance value of the second polysilicon resistor is greater than a resistance value for each series resistive segments, and wherein a resistance value of the third polysilicon resistor is greater than a resistance value for each series resistive segments.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims. For example, polysilicon resistor topologies with a passive breakdown protection circuit as described herein can be used for different input voltages (not just +/−60V as in the example given). As needed, the number of resistor segments and the resistor values of the passive breakdown protection circuit vary. Also, it should be noted that polysilicon resistor topologies with a passive breakdown protection circuit as described herein are compatible with different STI cone processes.

What is claimed is:

1. An electrical device, comprising:
   an integrated circuit having:
      device circuitry;
      a passive breakdown protection circuit; and
      a resistor coupled to or included with the device circuitry, wherein the resistor comprises:
         a polysilicon layer coupled between a first terminal and a second terminal;
         an epitaxial layer terminal; and
         a buried layer terminal,
         wherein the passive breakdown protection circuit is coupled between the second terminal and the epitaxial layer terminal, and
         wherein the passive breakdown protection circuit is coupled between the epitaxial layer terminal and the buried layer terminal.

2. The electrical device of claim 1, wherein the resistor is a segmented resistor having a plurality of series resistive segments, and wherein each of the plurality of series resistive segments comprises a shared substrate, an unshared buried layer, and an unshared epitaxial layer.

3. The electrical device of claim 2, wherein the first and second terminals are associated with a first of the series resistive segments, and wherein each of the series resistive segments comprises:
   a respective first terminal;
   a respective second terminal; and
   a respective polysilicon layer coupled between the respective first and second terminals.

4. The electrical device of claim 1, wherein the resistor is a segmented resistor having a plurality of series resistive segments, wherein each of the plurality of series resistive segments comprises a shared substrate, a shared buried layer, and a shared epitaxial layer.

5. The electrical device of claim 4, wherein the resistor is a first resistor, and wherein the passive breakdown protection circuit comprises a second resistor between the second terminal and the epitaxial layer terminal, and wherein a resistance value of the second resistor is greater than a resistance value for each of the series resistive segments.

6. The electrical device of claim 5, wherein the passive breakdown protection circuit comprises a third resistor between the epitaxial layer terminal and the buried layer terminal, and wherein a resistance value of the third resistor is greater than a resistance value for each of the series resistive segments.

7. The electrical device of claim 4, wherein the device circuitry comprises includes controller area network (CAN) transceiver circuitry coupled to one of the first or second terminals between the first terminal of the first of the series resistive segments and the second terminal of the last of the series resistive segments.

8. The electrical device of claim 4, wherein the device circuitry includes local interconnect network (LIN) transceiver circuitry coupled to one of the first or second terminals between the first terminal of the first of the series resistive segments and the second terminal of the last of the series resistive segments.

9. An integrated circuit, comprising:
   an input voltage node;
   a ground node;
   a semiconductor resistor coupled between the input voltage node and the ground node; and
   a passive breakdown protection circuit coupled to the semiconductor resistor, wherein the semiconductor resistor comprises:
      a polysilicon layer coupled between a first terminal and a second terminal;
      an epitaxial layer terminal; and
      a buried layer terminal,
      wherein the passive breakdown protection circuit is coupled between the second terminal and the epitaxial layer terminal, and
      wherein the passive breakdown protection circuit is coupled between the epitaxial layer terminal and the buried layer terminal.

10. The integrated circuit of claim 9, wherein the semiconductor resistor is a segmented resistor having a plurality of series resistive segments, wherein each of the plurality of series resistive segments comprises a shared substrate.

11. The integrated circuit of claim 10, wherein the first and second terminals are associated with a first of the series resistive segments, and wherein each of the series resistive segments comprises:
- a respective first terminal;
- a respective second terminal; and
- a respective polysilicon layer coupled between the respective first and second terminals.

12. The integrated circuit of claim 11, wherein the semiconductor resistor is a first semiconductor resistor, wherein the passive breakdown protection circuit comprises a second semiconductor resistor between the second terminal and the epitaxial layer terminal, and wherein a resistance value of the second semiconductor resistor is greater than a resistance value for each of the series resistive segments.

13. The integrated circuit of claim 12, wherein the passive breakdown protection circuit comprises a third semiconductor resistor between the epitaxial layer terminal and the buried layer terminal, and wherein a resistance value of the third semiconductor resistor is greater than a resistance value for each of the series resistive segments.

14. The integrated circuit of claim 11, further comprising controller area network (CAN) transceiver circuitry coupled to one of the first or second terminals between the first terminal of the first of the series resistive segments and the second terminal of the last of the series resistive segments.

15. The integrated circuit of claim 11, further comprising local interconnect network (LIN) transceiver circuitry coupled to one of the first or second terminals between the first terminal of the first of the series resistive segments and the second terminal of the last of the series resistive segments.

16. A polysilicon resistor arrangement, comprising:
- a first polysilicon resistor having a first terminal, a second terminal, an epitaxial layer terminal, and a buried layer terminal;
- a second polysilicon resistor coupled between the second terminal and the epitaxial layer terminal; and
- a third polysilicon resistor coupled between the epitaxial layer terminal and the buried layer terminal.

17. The polysilicon resistor arrangement of claim 16, wherein the first polysilicon resistor is a segmented resistor having a plurality of series resistive segments, wherein the plurality of series resistive segments share a substrate.

18. The polysilicon resistor arrangement of claim 17, wherein a resistance value of the second polysilicon resistor is greater than a resistance value for each series resistive segments, and wherein a resistance value of the third polysilicon resistor is greater than a resistance value for each series resistive segments.

* * * * *